United States Patent
Cleveland

[19]

[11] Patent Number: 6,160,740
[45] Date of Patent: Dec. 12, 2000

[54] METHOD TO PROVIDE A REDUCED CONSTANT E-FIELD DURING ERASE OF EEPROMS FOR RELIABILITY IMPROVEMENT

[75] Inventor: Lee Cleveland, Santa Clara, Calif.

[73] Assignee: Advanced Micro Devices, Inc., Sunnyvale, Calif.

[21] Appl. No.: 09/490,351

[22] Filed: Jan. 24, 2000

Related U.S. Application Data

[60] Provisional application No. 60/172,328, Dec. 17, 1999.

[51] Int. Cl.$^7$ .................................................. G11C 16/04

[52] U.S. Cl. ................................ 365/185.29; 365/185.33; 365/185.18; 365/185.24

[58] Field of Search ........................ 365/185.29, 185.33, 365/185.18, 185.24

[56] References Cited

U.S. PATENT DOCUMENTS

| | | | |
|---|---|---|---|
| 5,077,691 | 12/1991 | Haddad et al. | 365/218 |
| 5,428,578 | 6/1995 | Kaya et al. | 365/218 |
| 5,680,348 | 10/1997 | Chung et al. | 365/185.23 |
| 5,805,502 | 9/1998 | Tang et al. | 365/185.29 |
| 5,917,757 | 6/1999 | Lee et al. | 365/185.33 |
| 6,049,479 | 4/2000 | Thurgate et al. | 365/185.18 |

*Primary Examiner*—Richard Elms
*Assistant Examiner*—Tuan T. Nguyen
*Attorney, Agent, or Firm*—H. Donald Nelson

[57] ABSTRACT

A method to reduce the peak electric field during erase of a memory device composed of multiple memory cells. The electric field $E_{field}$ of the memory cell during erase is determined by the equation $E_{field} \sim a_g(V_{gate}-V_{th}+V_{tuv})+(a_s-1)V_{source}$ and varying gate voltages $V_{gate}$ are applied to the gate of the cell being erased so that the $V_{gate}-V_{th}$ is constant during the erase procedure.

3 Claims, 6 Drawing Sheets

METHOD TO PROVIDE A REDUCED CONSTANT E-FIELD DURING ERASE OF EEPROMS FOR RELIABILITY IMPROVEMENT

This application claim benefit to provisional application 60/172,328 filing date Dec. 17, 1999.

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing microelectronic flash Electrically Erasable Programmable Read-Only Memory devices that provides a reduced constant electric field during erase.

2. Discussion of the Related Art

A microelectronic flash or block erase Electrically Erasable Programmable Read-Only Memory (Flash EEPROM) includes an array of cells that can be independently programmed and read. The size of each cell and thereby the memory are made small by omitting transistors known as select transistors that enable the cells to be erased independently. As a result, all of the cells are erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying a voltage, typically 9 volts to the control gate, applying a voltage of approximately 5 volts to the drain and grounding the source, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically 5 volts to the control gate, applying 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erase a cell. This causes the electrons that were injected into the floating gate during programming to undergo Fowler-Nordheim tunneling from the floating gate through the thin tunnel oxide layer to the source. Applying a negative voltage on the order of minus 10 volts to the control gate, applying 5 volts to the source and allowing the drain to float can also erase a cell. Another method of erasing a cell is by applying 5V to the P-well and minus 10 volts to the control gate while allowing the source/drain to float.

Significant problems exist during erase that result in decreased reliability of the memory cell. During a negative gate edge erase procedure some current flows from the double diffused source region into the substrate when the source junction is reverse biased during erase. This current is referred to as band-to-band tunneling current. The magnitude of the band-to-band tunneling current depends upon the magnitude reverse bias voltage applied to the source region. With the control gate biased at a negative voltage, the hole component (called "hot holes") of the band-to-band tunneling current tends to follow the electric field and bombard the semiconductor dielectric interface between the substrate and the tunnel oxide. These hot holes can damage the interface by generating undesirable interface states. In addition, some of these hot holes may actually have enough energy to be injected into the tunnel oxide, where they are trapped. These trapped hot holes degrade the performance of the memory device. The negative control gate voltage technique for erasing memory cells generate hole trap-ups and interface states that cause reliability problems such as window-opening, charge loss, erratic erase and accentuating gate disturb. These interface states and trapped holes distribute themselves laterally from the source PN junction that is formed at the interface between the source and substrate and into the channel region of the cell. The peak density and the width of this trapped hole distribution depend upon both the junction bias and the control gate bias during the negative gate edge erase operation.

During a negative gate channel erase procedure, the electrons in the floating gate tunnel vertically through the tunnel oxide into the channel region of the cell. Since there is no electrical bias between the source region and the p-well region, there is no band-to-band current. However, other device reliability problems result. For example, since erasing is done along the channel region, interface generation and oxide trap-up are distributed along the entire length of the channel region. Such a concentration of interface states and oxide trap-up degrades the memory cell read current, which may in turn slow down the reading speed and eventually cause read errors. Trap-up at the portion of the oxide layer near the drain junction may also retard hot electron injection during programming. The amount of interface generation and oxide trap-up are dependent upon the peak electric field generated during the erase procedure.

Therefore, what is needed are methods of erasing memory cells that reduces the peak electric field across the tunnel oxide during erase without reducing the erase speed.

SUMMARY OF THE INVENTION

According to the present invention, the foregoing and other objects and advantages are obtained by a method of erasing a memory device that reduces the peak electric field across the tunnel oxide during erase.

In accordance with one aspect of the invention, the peak electric field during erase is achieved by keeping the quantity $V_{gate} - V_{th}$ in the equation $E_{field} = a_g(V_{gate} - V_{th} + V_{tuv}) + (a_s - 1) V_{souce}$. Because the other factors is the equation are constant, holding the quantity $V_{gate} - V_{th}$ results in $E_{field}$ being constant. The values of $V_{gate}$ are controlled so that the $E_{field}$ is less than the prior art methods of erasing.

In accordance with another aspect of the invention, in a negative gate edge erase procedure, the voltage applied to the source is approximately 5 volts.

In accordance with another aspect of the invention, in a negative gate channel erase procedure, the source voltage is allowed to float.

The described method thus provides a method of erasing memory cells with a reduced constant electric field applied to the cell during erase.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention that illustrate the best mode presently contemplated by the inventor for practicing the invention. It should be understood that the description of the best mode is merely illustrative and that it should not be taken in a limiting sense.

Figure 1A:
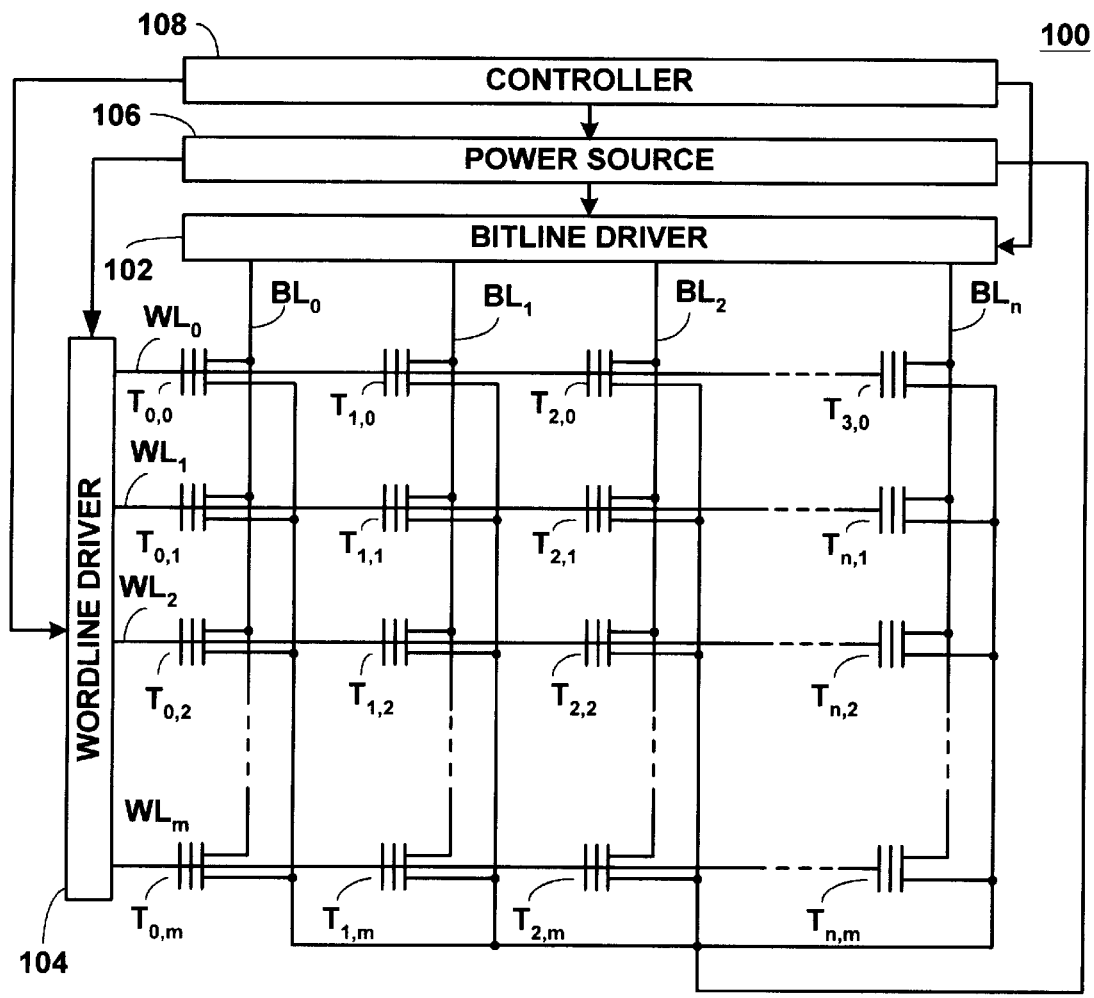
FIG. 1A is a simplified electrical schematic diagram of a flash EEPROM memory device.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 102, whereas appropriate voltages are applied to the wordlines by a wordline driver 104. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
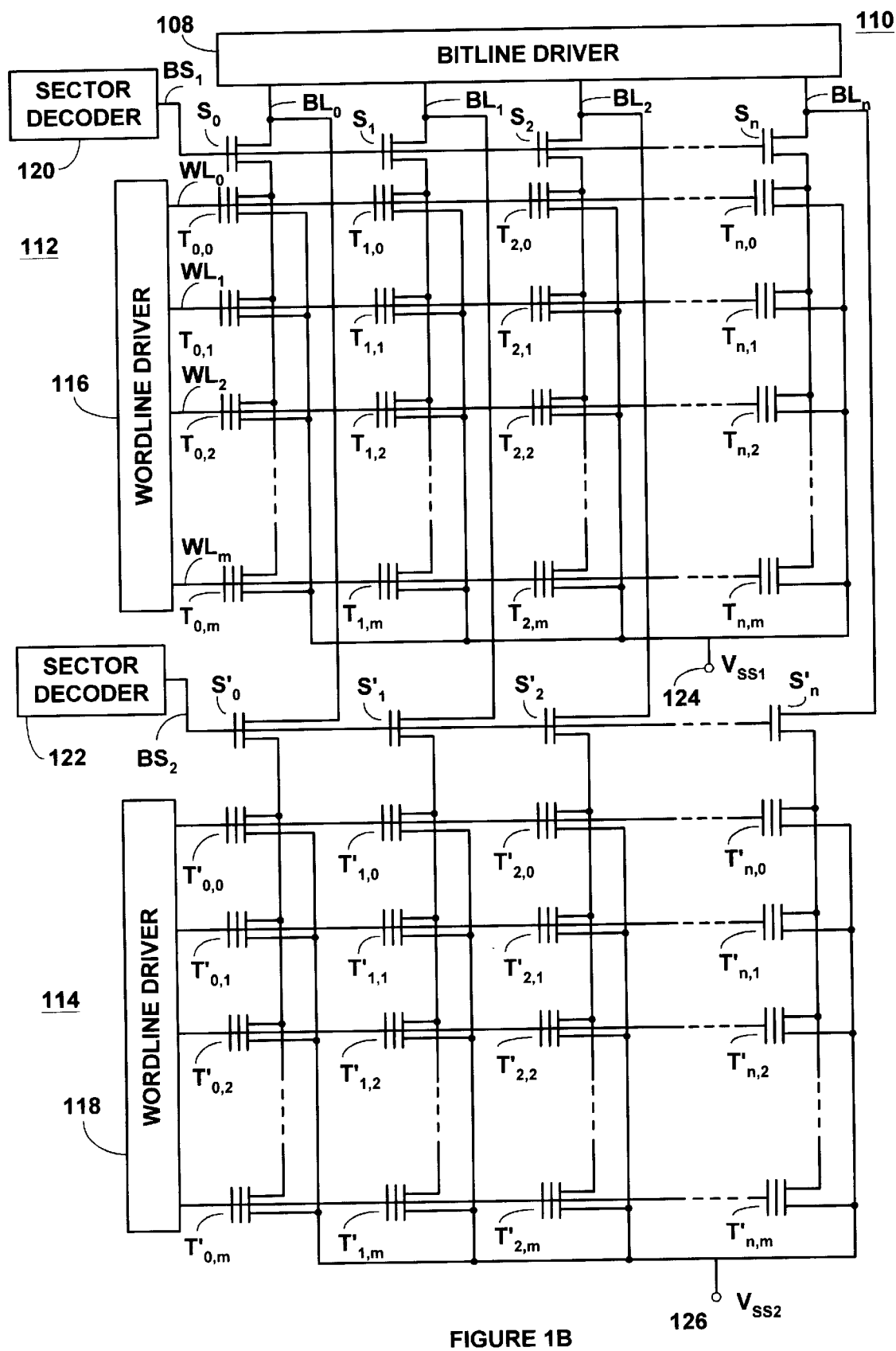
FIG. 1B is similar to FIG. 1A but illustrates a flash EEPROM memory device having cells arranged in two pages, sectors or banks.

FIG. 1B illustrates another flash EEPROM memory 110 which is similar to the memory 100 except that the cells are divided into a banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently.

Figure 2A:
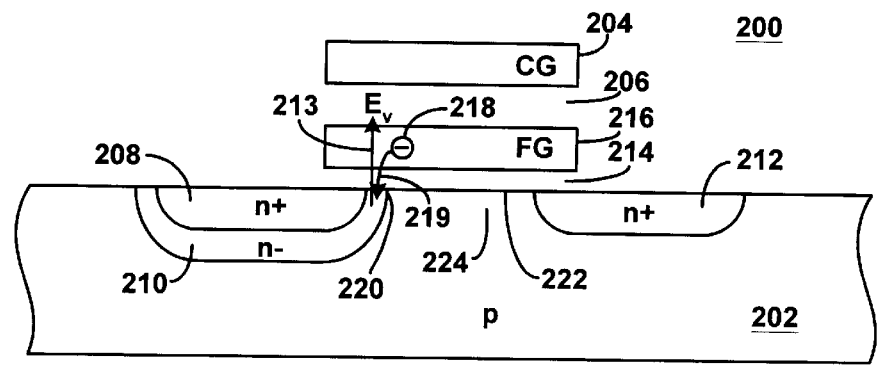
FIG. 2A is a cross-sectional view of a flash EEPROM memory cell illustrating a negative control gate voltage method of erasing the memory cell.

FIG. 2A is a simplified sectional view illustrating the construction of one type of memory cell 200. The memory cell 200 uses hot-electrons for programming and Fowler-Nordheim tunneling using a negative control gate voltage for erasing. The memory cell 200 is fabricated on a p-type substrate 202, which is maintained at ground potential during operation. To erase the memory cell, a negative control gate voltage technique is used whereby a large negative voltage of about minus 10 volts is applied to the control gate 204, which is formed on insulator 206. At the same time a moderate positive voltage of about 5 volts is applied to the source region, which is comprised of n+ region 208 and an n− region 210. Drain region 212 is floated during erase. The resulting vertical electric field $E_v$, indicated at 213, across silicon dioxide layer 214 located between floating gate 216 and the source region 208, 210 causes the electrons 218 in the floating gate 216 to tunnel through the dielectric layer 214, as indicated by arrow 219, into the source region 208, 210.

A significant problem during erase is that some current flows from the combined source region 208, 210 into the substrate 202 when the source junction 220 is reverse biased during erase. This current is referred to as band-to-band (BB) tunneling current. The magnitude of the band-to-band tunneling current depends upon the magnitude of the reverse bias voltage applied to source region 220. With control gate 204 biased at a negative voltage, the hole component (called "hot holes") of the band-to-band tunneling current tends to follow the electric field and bombard semiconductor dielectric interface 222 and the dielectric layer 214. These hot holes can damage the interface 222 by generating undesirable interface states. In addition, some of these hot holes may actually have enough energy to be injected into dielectric layer 214, where they are trapped. These trapped hot holes degrade the performance of the memory device. The negative control gate voltage technique for erasing memory cells generate hole trap-ups and interface states that cause reliability problems such as window-opening, charge loss, erratic erase and accentuating gate disturb. These interface states and trapped holes distribute themselves laterally from the source PN junction 220 into the channel region 224. The peak density and the width of this trapped hole distribution depend upon both the junction bias and the control gate bias during the erase operation. For a long channel device, the width of this hole distribution is small relative to the entire channel length, and its adverse impact on device reliability and performance is small. However, for a deep, sub-micron device, the width of this distribution becomes a significant proportion of the channel length. As such, its adverse impact upon device reliability and performance is much more significant.

Figure 2B:
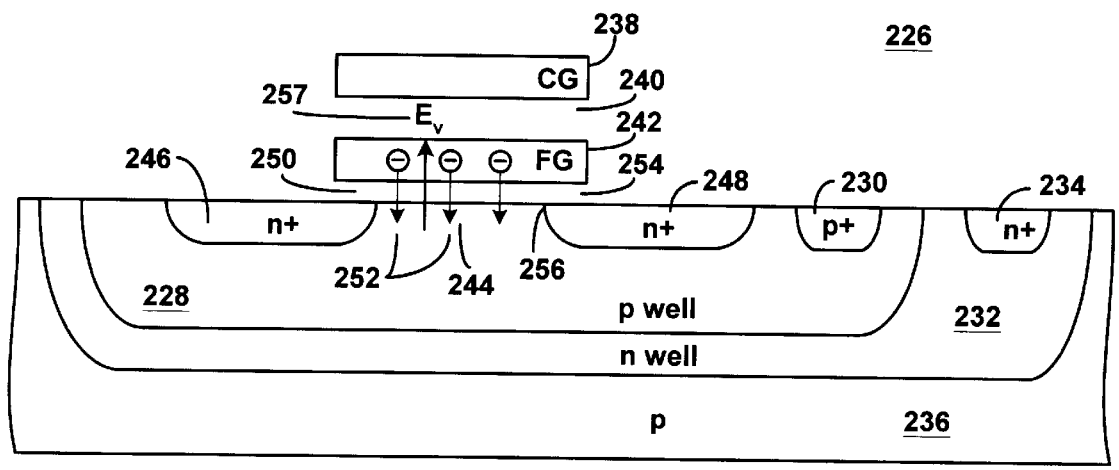
FIG. 2B is a cross-sectional view of a flash EEPROM memory cell illustrating a negative gate channel erase method of erasing the memory cell.

FIG. 2B is a simplified sectional view illustrating the construction of a second type of memory cell 226. The memory cell 226 is formed in a p-well 228, which may be electrically contacted using p+ region 230. The p-well 228 is formed in an n-well region 232, which may be electrically contacted using n+ region 234. The n-well region 232 is formed in a p substrate 236. To erase memory cell 226, a large negative voltage of about minus 10 volts is applied to control gate 238. Control gate 238 is formed on insulator 240, which, in turn, is formed on floating gate 242. At the same time as the negative voltage is applied to the control gate, a moderate positive voltage of about 5 volts is applied to the p-type channel region 244 through p+ region 230 and p-well region 228. Because the p-type substrate 236 is grounded, the application of a positive voltage through p+ contact region 230 to p-type channel region 244 requires the formation of the isolated p-well 228 inside n-well 232. During erase, source region 246 and drain region 248 are floated at a potential below the bias voltage of p-well 228. This potential depends upon the geometry of the source and drain regions 246 & 248 and also upon the amount of leakage current from the drain and source regions. This erase technique is referred to as the negative gate channel erase technique. In the negative gate channel erase technique, the electrons in the floating gate 242 tunnel vertically through floating gate dielectric 250 into the channel region 244 as indicated by the vertical, downwardly pointing arrows 252. Since there is no electrical bias between the source region 246 and the p-well region 228, and the source region 246 is floating, no band-to-band current exists. However, in a stacked gate flash memory, other device reliability problems may result. For instance, since erasing is done over the channel region 244, interface state generation and oxide trap-up are all distributed along the channel region 244. Such a concentration of interface states and oxide trap-up degrades the memory cell read current, which may in turn slow down the reading speed and may eventually cause read errors. Trap-up at the portion 254 of the oxide layer 250, which lies beneath floating gate 242 and above the drain junction 256, may also retard hot electron injection during programming. The vertical electrical field $E_v$ is shown at 257.

The background and associated device reliability issues with respect to these erase techniques are described in the following publications: Haddad, et al., "Degradation Due to Hole Trapping in Flash Memory Cell," IEEE Electronic Devices Letters, Vol. 10., No. 3, March 1989, pp. 177–179; Chun, et al., "Lateral Distribution of Erase Induced Damage in Flash EPROM Device," SRC Techcon, September 1996; Chun, et al., "Lateral Distribution of Erase Induced Hole trapping and Interface Traps in Flash EPROM NMOSFET Devices, "IEEE Semicondutor Interface Specialists Conference, 1996; Witters, et al., "Degradation of Tunnel-Oxide Floating Gate EPROM Devices and Correlation With High-Field-Current-Induced Degradation of Thin Gate Oxides," IEEE Transactions On Electron Devices, Vol. 36, No. 9, September 1989, p. 1663; and Kobayashi, et al., "Memory Array Architecture and Decoding Scheme for 3 V Only Sector Erasable DINOR Flash Memory," IEEE Journal of Solid-State Circuits, Vol. 29, No. 4, April 1994, pp. 454–458.

Figure 3:
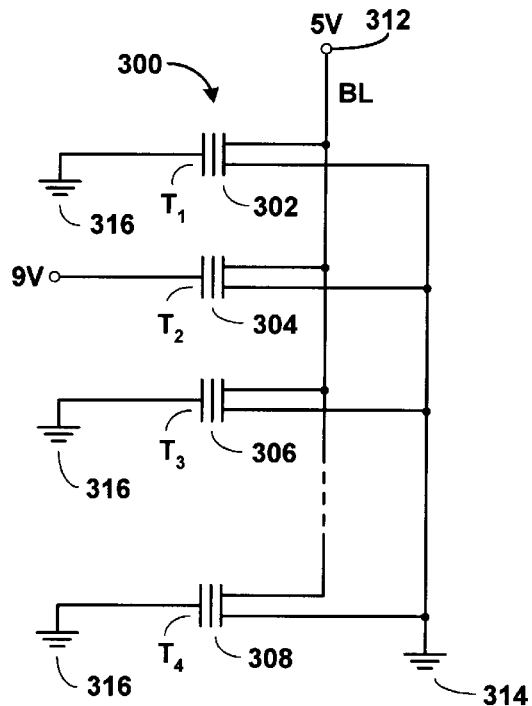
FIG. 3 is a simplified electrical schematic diagram of a column of flash EEPROM cells showing the control gate, source and drain voltages during the programming of one of the cells.

FIG. 3 is a simplified electrical schematic diagram of a column 300 of flash EEPROM cells 302, 304, 306, 308 showing the control gate, source and drain voltages during the programming of one of the flash cells. The cell 304 is programmed by applying relatively high voltage to the control gate of the selected cell, typically approximately 9 volts as shown at 310, applying a moderate voltage to the drain via the bitline (BL), typically approximately 5 volts as shown at 312, and grounding the source as shown at 314. The gates of the non-selected flash cells are grounded as shown at 316. This combination of programming voltages causes hot electrons to be injected from the drain depletion region into the floating gate of cell 304. Upon removal of the various programming voltages, the injected electrons are trapped in the floating gate and create a negative charge therein, which increases the threshold voltage of cell 304 to a value in excess of approximately 4 volts.

Figure 4A:
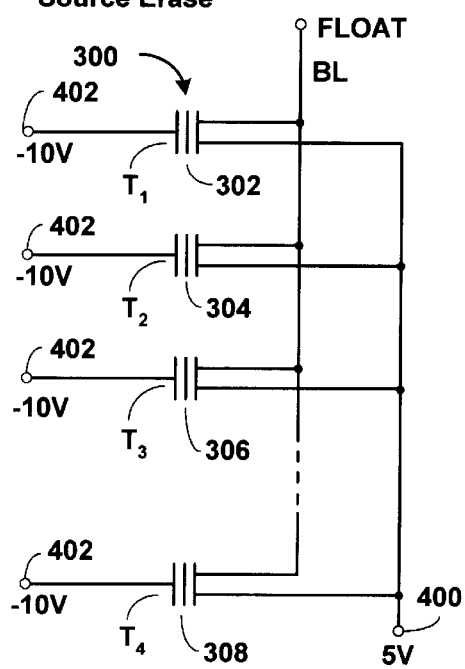
FIG. 4A is a simplified electrical schematic diagram of a column of flash EEPROM cell showing the control gate, source and drain voltages during a first prior art method of erasing the cells in the column.

FIG. 4A is a simplified electrical schematic diagram of the column 300 of flash EEPROM cells 302, 304, 306, and 308 as shown in FIG. 3, and showing the control gate, source and drain voltages during the erasure of all of the flash cells in accordance with the prior art. As is known in the art, all of the cells are erased simultaneously. In the erasure method shown in FIG. 4A, a moderately high voltage, typically 5 volts, is applied to the sources as shown at 400, a negative voltage of approximately minus 10 volts is applied to control gates as shown at 402, and the drains are floated as shown at 404. This causes the electrons that were injected into the floating gate during programming to be removed by Fowler-Nordheim tunneling from each of the floating gates through the respective tunnel oxide layers to the respective source regions.

Figure 4B:
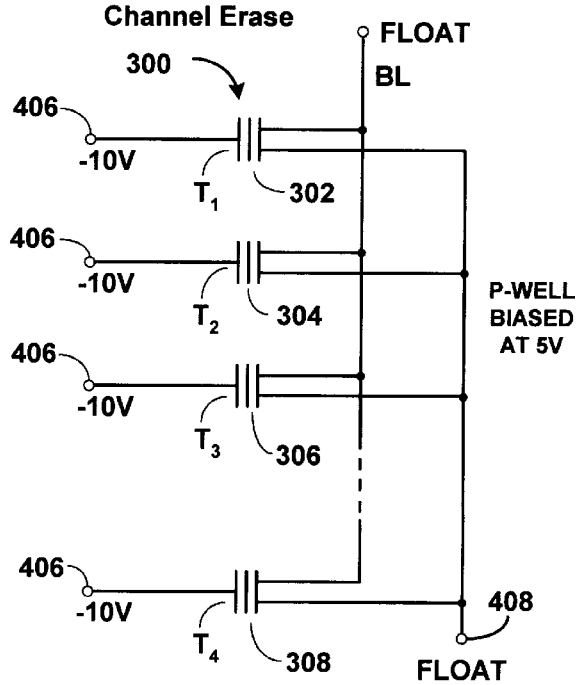
FIG. 4B is a simplified electrical schematic diagram of a column of flash EEPROM cells showing the control gate, source and drain voltages during a second prior art method of erasing the cells in the column.

FIG. 4B shows an alternative prior art method of erasing the column 300 of flash EEPROM cells 302, 304, 306, and 308 as shown in FIG. 4A, wherein the P-well is biased at 5 V and a negative voltage on the order of minus 10 volts is applied to the control gates as shown at 406 and the sources and drains are floated as indicated at 408 and 410, respectively.

In each of the above method of erasing, the memory cells are erased by applying one or more erase pulses to all of the cells (or all of the cells in a bank or sector) of the memory. In the discussion below, the memory cells are assumed to be NMOS enhancement mode FETs. However, it will be understood that the invention is not so limited and that the scope thereof encompasses applying the principles described herein to other types and configurations including, for example, PMOS and/or depletion mode FETs in any combination.

Figure 5:
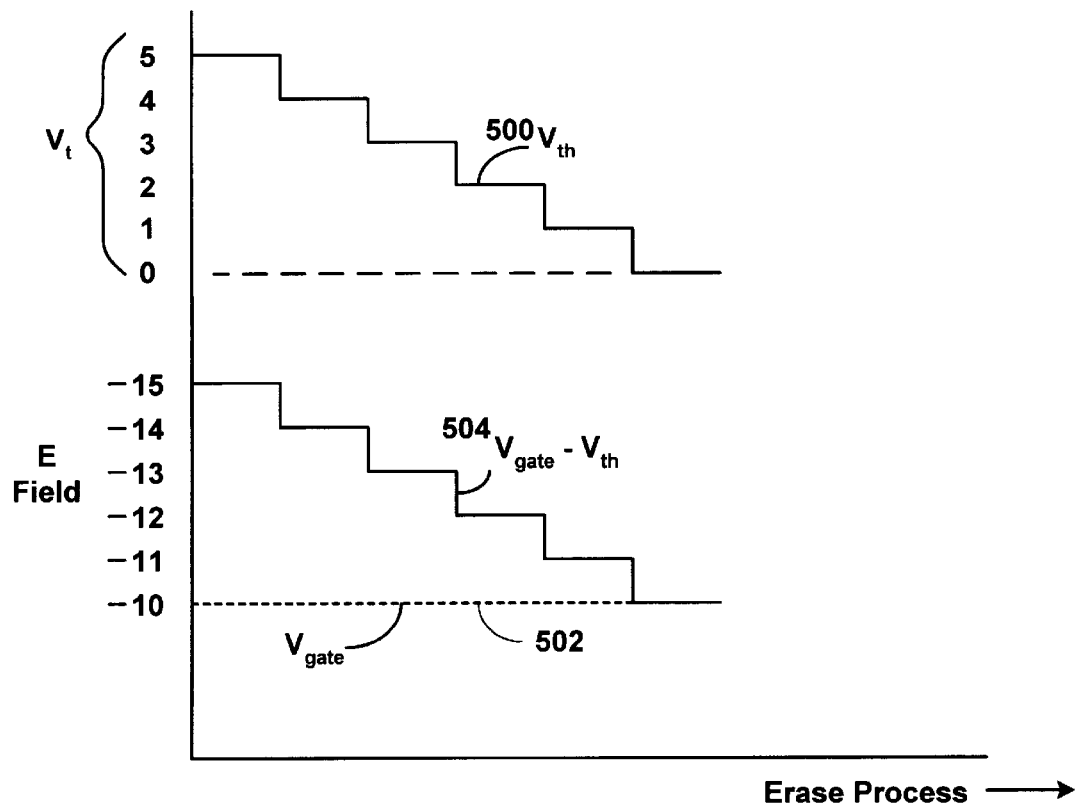
FIG. 5 is graph showing the voltages applied to a flash memory cell during a prior art method of erase.

FIG. 5 is a graphical representation of the voltages that exist in a flash memory cell during a prior art erase procedure erase. The electric field $E_{field}$ across the tunnel oxide is proportional to the following voltages; the voltage applied to the gate of the cell $V_{gate}$, the threshold voltage $V_{th}$ of the cell when the gate voltage $V_{gate}$ is applied to the cell, the voltage applied to the source $V_{source}$, and the threshold voltage after an initial u.v. (ultraviolet) erase $V_{tuv}$ as presented by the following relationship:

$$E_{field} \sim a_g(V_{gate} - V_{th} + V_{tuv}) + (a_s - 1)V_{source} \quad (1)$$

where $a_g$ is the word line to the floating gate coupling constant and $a_s$ is the source to floating gate coupling constant.

In the prior art, the voltage applied to the gate $V_{gate}$ is constant, the voltage applied to the source $V_{source}$ is constant and the voltage $V_{tuv}$ is constant. The erase pulses cause the threshold voltage $V_{th}$ to decrease (this is the purpose of the erase pulses). As can be appreciated, since the prior art method shows a constant voltage applied to the gate, it is necessary to apply a relatively high voltage to the gate so that the erase can proceed until the cell has a zero voltage threshold. In FIG. 5, graph 500 illustrates the decrease of the threshold voltage $V_{th}$ of the memory cell as the number of erase pulses increase. The dotted line 502 represents the constant voltage $V_{gate}$ applied to the gate during the entire erase procedure. Graph 504 is the total voltage difference represented by $V_{gate}$ (which is negative) and $V_{th}$ (which is positive) applied to the cell [because the voltage applied to the source and the voltage $V_{tuv}$ constant during the erase procedure, they are not considered or shown]. Because the electric field $E_{field}$ is proportional to the difference voltage difference between the voltage applied to the gate $V_{gate}$ and the threshold voltage $V_{th}$ of the cell being erased, the peak electric field $E_{field}$, in this case, would be proportional to approximately 15 volts (assuming that the threshold voltage of the memory cell at the beginning of erase is 5 volts).

Figure 6:
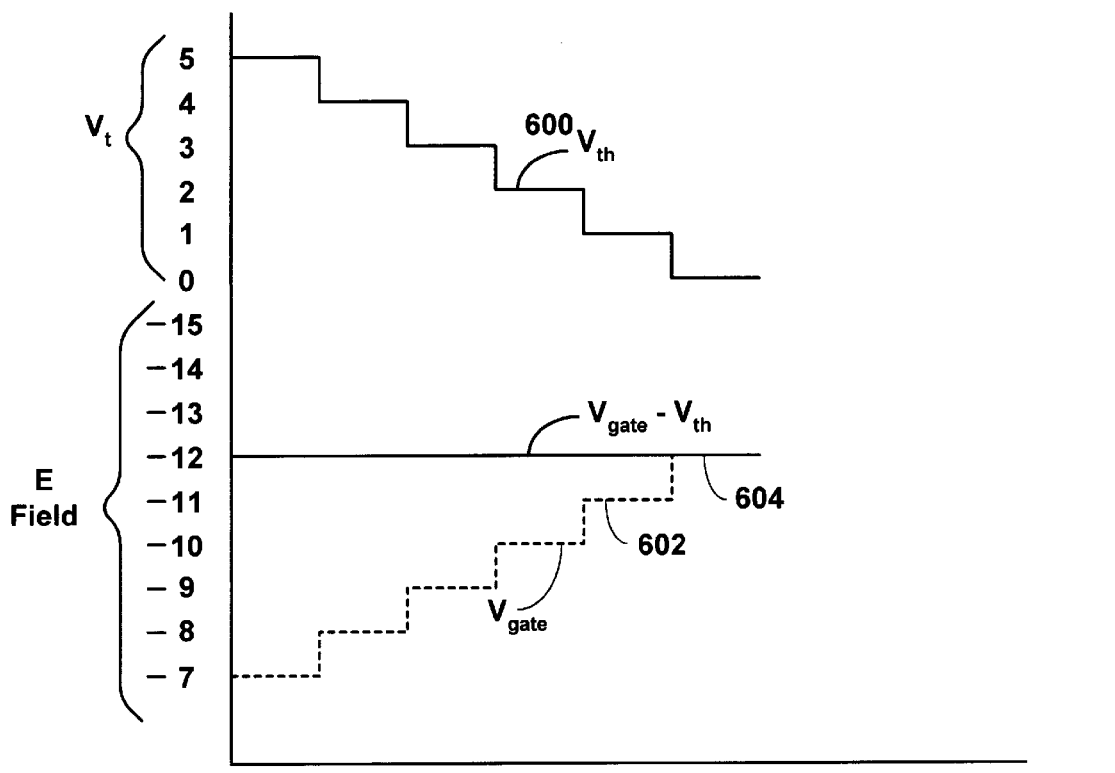
FIG. 6 is a graph showing the voltages applied to a flash memory cell during a method of erase in accordance with the present invention.

FIG. 6 is a graphical representation of the voltages that exist in a flash memory cell during an erase procedure in accordance with the present invention. Like the prior art model shown graphically in FIG. 5 the electric field $E_{field}$ across the tunnel oxide is proportional to the following voltages; the voltage applied to the gate of the cell $V_{gate}$, the threshold voltage $V_{th}$ of the cell when the gate voltage $V_{gate}$ is applied to the cell, the voltage applied to the source $V_{source}$, and the threshold voltage after an initial u.v. (ultraviolet) erase $V_{tuv}$ as presented by the following relationship:

$$E_{field} \sim a_g(V_{gate} - V_{th} + V_{tuv}) + (a_s - 1)V_{source} \quad (1)$$

where $a_g$ is the word line to the floating gate coupling constant and $a_s$ is the source to floating gate coupling constant.

In the present invention, in order to reduce the peak electric field across the tunnel oxide and to keep the electric field constant, the voltage applied to the gate $V_{gate}$ is varied to keep pace with the varying threshold voltage [as discussed above, the voltage applied to the source $V_{source}$ and the voltage $V_{tuv}$ does not change during the erase procedure and will not be considered]. This reduces the initial electric field $E_{field}$ and substantially reduces the amount of carrier generation that damages the tunnel oxide and degrades the reliability of the cell. As can be appreciated, the electric field $E_{field}$ must also be high enough to complete the erase in a timely manner. The solution to these two competing factors is to increase the magnitude of the negative voltage applied to the gate $V_{gate}$ as the magnitude of the threshold voltage decreases during the erase procedure. Graph 600 in FIG. 6 is a representation of the threshold voltage $V_t$ and illustrates how the threshold voltage $V_t$ decreases during erase. The dotted line 602 illustrates how the voltage applied to the gate $V_{gate}$ is varied as the threshold voltage $V_t$ decreases. Graph 604 illustrates the resulting constant voltage $V_{gate} - V_{th}$. Because the electric field $E_{field}$ is proportional to the voltages as shown in formula (1), the peak electric field $E_{field}$ is substantially constant at a reduced value. This reduced peak electric field substantially reduces the number of carriers that are generated and thus substantially improves the reliability of the memory cell. In addition, the reduced constant electric field $E_{field}$ is high enough that the speed of the erase is not degraded. The timing of the change of the gate voltage $V_{gate}$ to correspond to the change of the threshold voltage $V_{th}$ of the cell during erase is determined by a characterization procedure of the particular memory cell. The characterization procedure can be an empirical procedure or a computer modeling procedure.

Figure 7:
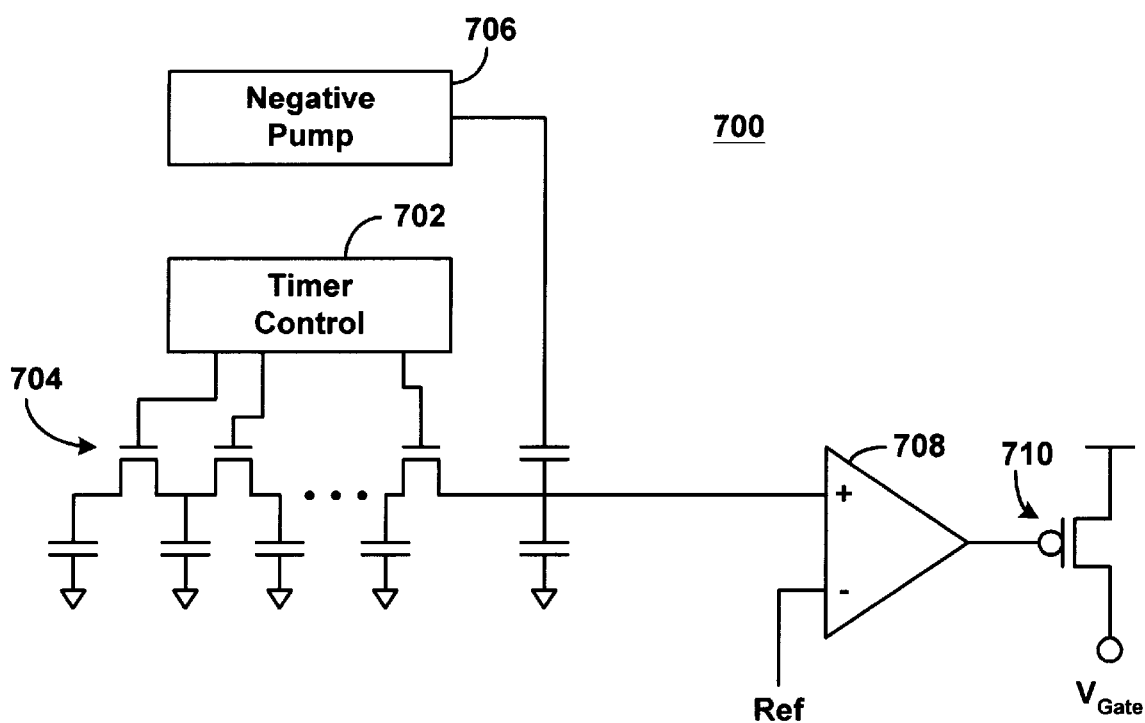
FIG. 7 shows a simplified electrical schematic diagram of an electrical circuit that can be used to apply the varying voltage to the control gate in accordance with the present invention.

FIG. 7 shows a simplified electrical schematic diagram of an electrical circuit 700 that can be used to apply the varying voltage to the control gate $V_{gate}$ of the cells being erased in accordance with the present invention. The electrical circuit 700 comprises a timer control unit 702 that controls transistors 704 that in turn control the current from a negative pump 706. The current from the negative pump is input to a proportional amplifier 708 that is connected to the gate of a transistor 710 that outputs the varying control gate voltage $V_{gate}$. Referring to FIGS. 1A & 1B, the time control unit 702 could be made a part of controller 108 and the transistors 704, the proportional amplifier 708, and the transistor 710 could be made a part of the wordline driver 104 (FIG. 1A) or the wordline drivers 116 & 118 (FIG. 1B).

In summary, the present invention overcomes the limitations of the prior art and provides a method of erasing memory cells with a reduced constant electric field applied to the cell during erase. The reduced electric field substantially reduces the number of carriers that are generated and thus substantially improves the reliability of the memory cell.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method to reduce the peak electric field during an erase procedure of a memory device composed of multiple memory cells each having a source and a control gate, wherein the electric field $E_{field}$ is determined by the equation $E_{field} \sim a_g(V_{gate} - V_{th} + V_{tuv}) + (a_s - 1)V_{source}$; the method comprising:

(a) applying a voltage $V_{source}$ to the source of the cell to be erased; and (b) applying varying voltages $V_{gate}$ to the control gate of the cell to be erased, wherein $V_{gate} - V_{th}$ is constant during the erase procedure.

2. The method of claim 1 further comprising step (c) performing an initial ultraviolet erase on the cell to be erased resulting in an ultraviolet erase threshold voltage, $V_{tuv}$.

3. The method of claim 2 wherein the voltage $V_{source}$ is approximately 5 volts.

* * * * *